United States Patent
Streefkerk et al.

(10) Patent No.: US 7,671,963 B2
(45) Date of Patent: *Mar. 2, 2010

(54) LITHOGRAPHIC APPARATUS AND DEVICE MANUFACTURING METHOD

(75) Inventors: Bob Streefkerk, Tilburg (NL); Henrikus Herman Cox, Eindhoven (NL); Christiaan Alexander Hoogendam, Veldhoven (NL); Jeroen Johannes Sophia Maria Mertens, Duizel (NL); Koen Jacobus Johannes M Zaal, Eindhoven (NL); Minne Cuperus, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 143 days.

This patent is subject to a terminal disclaimer.

(21) Appl. No.: 11/132,415

(22) Filed: May 19, 2005

(65) Prior Publication Data

US 2005/0270506 A1 Dec. 8, 2005

Related U.S. Application Data

(63) Continuation-in-part of application No. 10/850,451, filed on May 21, 2004.

(51) Int. Cl.
*G03B 27/42* (2006.01)
*G03B 27/32* (2006.01)
(52) U.S. Cl. ............................. 355/30; 355/53; 355/72; 355/77; 430/30
(58) Field of Classification Search .................. 355/30, 355/53, 67, 72, 77; 430/30, 311
See application file for complete search history.

(56) References Cited

U.S. PATENT DOCUMENTS

| 3,573,975 A | 4/1971 | Dhaka et al. ................. 117/212 |
| 3,648,587 A | 3/1972 | Stevens ......................... 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ............ 430/326 |
| 4,480,910 A | 11/1984 | Takanashi et al. ............. 355/30 |
| 4,509,852 A | 4/1985 | Tabarelli et al. ............... 355/30 |
| 5,040,020 A | 8/1991 | Rauschenbach et al. ....... 355/53 |
| 5,121,256 A | 6/1992 | Corle et al. .................. 359/664 |
| 5,528,118 A | 6/1996 | Lee |
| 5,610,683 A | 3/1997 | Takahashi .................... 355/53 |

(Continued)

FOREIGN PATENT DOCUMENTS

DE 206 607 2/1984

(Continued)

OTHER PUBLICATIONS

English translation of German Patent document DD 221 563 A1 (dated Apr. 1985) cited by Applicant.*

(Continued)

*Primary Examiner*—Alan A Mathews
(74) *Attorney, Agent, or Firm*—Pillsbury Winthrop Shaw Pittman LLP

(57) ABSTRACT

An immersion lithographic apparatus includes a liquid supply system member configured to contain a liquid in a space between a projection system of the lithographic apparatus and the substrate and a liquid supply system member compensator arranged to compensate an interaction between the liquid supply system member and substrate table.

19 Claims, 8 Drawing Sheets

U.S. PATENT DOCUMENTS

| | | |
|---|---|---|
| 5,623,853 A | 4/1997 | Novak et al. |
| 5,715,039 A | 2/1998 | Fukuda et al. ................. 355/53 |
| 5,825,043 A | 10/1998 | Suwa ......................... 250/548 |
| 5,874,820 A | 2/1999 | Lee |
| 5,900,354 A | 5/1999 | Batchelder .................. 430/395 |
| 5,969,441 A | 10/1999 | Loopstra et al. |
| 6,191,429 B1 | 2/2001 | Suwa ......................... 250/548 |
| 6,236,634 B1 | 5/2001 | Lee et al. .................... 369/112 |
| 6,262,796 B1 | 7/2001 | Loopstra et al. |
| 6,400,441 B1 | 6/2002 | Nishi et al. |
| 6,560,032 B2 | 5/2003 | Hatano ....................... 359/656 |
| 6,600,547 B2 | 7/2003 | Watson et al. |
| 6,603,130 B1 | 8/2003 | Bisschops et al. ......... 250/492.1 |
| 6,633,365 B2 | 10/2003 | Suenaga ...................... 355/53 |
| 6,778,257 B2 | 8/2004 | Bleeker et al. |
| 2002/0020821 A1 | 2/2002 | Van Santen et al. ......... 250/492 |
| 2002/0163629 A1 | 11/2002 | Switkes et al. ................ 355/53 |
| 2003/0123040 A1 | 7/2003 | Almogy ....................... 355/69 |
| 2003/0174408 A1 | 9/2003 | Rostalski et al. ............ 359/642 |
| 2004/0000627 A1 | 1/2004 | Schuster |
| 2004/0021844 A1 | 2/2004 | Suenaga |
| 2004/0075895 A1 | 4/2004 | Lin ............................. 359/380 |
| 2004/0109237 A1 | 6/2004 | Epple et al. |
| 2004/0119954 A1 | 6/2004 | Kawashima et al. .......... 355/30 |
| 2004/0125351 A1 | 7/2004 | Krautschik ................... 355/53 |
| 2004/0165159 A1 | 8/2004 | Lof et al. |
| 2004/0239954 A1 | 12/2004 | Bischoff ..................... 356/635 |
| 2004/0257544 A1 | 12/2004 | Vogel et al. .................. 355/30 |
| 2004/0263809 A1 | 12/2004 | Nakano ....................... 355/30 |
| 2005/0024609 A1 | 2/2005 | De Smit et al. ............... 355/18 |
| 2005/0030497 A1 | 2/2005 | Nakamura ................... 355/30 |
| 2005/0036121 A1* | 2/2005 | Hoogendam et al. .......... 355/30 |
| 2005/0046813 A1 | 3/2005 | Streefkerk et al. ............ 355/30 |
| 2005/0046934 A1 | 3/2005 | Ho et al. ..................... 359/380 |
| 2005/0052632 A1 | 3/2005 | Miyajima .................... 355/53 |
| 2005/0068499 A1 | 3/2005 | Dodoc et al. |
| 2005/0073670 A1 | 4/2005 | Carroll |
| 2005/0088635 A1 | 4/2005 | Hoogendam et al. |
| 2005/0094125 A1 | 5/2005 | Arai ............................ 355/72 |
| 2005/0122505 A1 | 6/2005 | Miyajima .................... 355/72 |
| 2005/0132914 A1 | 6/2005 | Mulkens et al. .......... 101/463.1 |
| 2005/0134817 A1 | 6/2005 | Nakamura ................... 355/53 |
| 2005/0140948 A1 | 6/2005 | Tokita ......................... 355/30 |
| 2005/0145265 A1 | 7/2005 | Ravkin et al. |
| 2005/0146693 A1 | 7/2005 | Ohsaki ........................ 355/30 |
| 2005/0146694 A1 | 7/2005 | Tokita ......................... 355/30 |
| 2005/0151942 A1 | 7/2005 | Kawashima ................. 355/30 |
| 2005/0200815 A1 | 9/2005 | Akamatsu ................... 353/53 |
| 2005/0213065 A1 | 9/2005 | Kitaoka ....................... 355/53 |
| 2005/0213066 A1 | 9/2005 | Sumiyoshi ................... 355/53 |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1* | 10/2005 | Cox et al. ..................... 355/18 |
| 2005/0219489 A1 | 10/2005 | Nei et al. ..................... 355/53 |
| 2005/0233081 A1 | 10/2005 | Tokita ........................ 427/256 |
| 2005/0253090 A1 | 11/2005 | Gau et al. |
| 2005/0259233 A1 | 11/2005 | Streefkerk et al. ............ 355/53 |
| 2005/0259234 A1 | 11/2005 | Hirukawa et al. |
| 2005/0280791 A1 | 12/2005 | Nagasaka et al. |
| 2005/0286032 A1 | 12/2005 | Lof et al. |
| 2006/0005860 A1 | 1/2006 | Garcia |
| 2006/0066828 A1 | 3/2006 | Klerk |
| 2006/0098177 A1 | 5/2006 | Nagasaka |
| 2006/0114445 A1 | 6/2006 | Ebihara |
| 2006/0119807 A1 | 6/2006 | Baselmans et al. |
| 2006/0139613 A1 | 6/2006 | Houkes et al. |
| 2006/0215131 A1 | 9/2006 | Van Der Toorn et al. ...... 355/30 |
| 2007/0081136 A1 | 4/2007 | Hara |

FOREIGN PATENT DOCUMENTS

| | | |
|---|---|---|
| DE | 221 563 | 4/1985 |
| DE | 224448 | 7/1985 |
| DE | DD 224 448 A1 | 7/1985 |
| DE | 242880 | 2/1987 |
| EP | 0023231 | 2/1981 |
| EP | 0418427 | 3/1991 |
| EP | 0 834 773 A2 | 4/1998 |
| EP | 1039511 | 9/2000 |
| EP | 1 420 298 A2 * | 5/2004 |
| EP | 1 420 300 A2 | 5/2004 |
| EP | 1 477 856 A1 | 11/2004 |
| FR | 2474708 | 7/1981 |
| JP | 58-202448 | 11/1983 |
| JP | A 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | A 6-53120 | 2/1994 |
| JP | 06-124873 | 5/1994 |
| JP | 6-188169 | 7/1994 |
| JP | 07-132262 | 5/1995 |
| JP | 07-220990 | 8/1995 |
| JP | A 8-166475 | 6/1996 |
| JP | A 08-316125 | 11/1996 |
| JP | A 8-330224 | 12/1996 |
| JP | A 10-163099 | 6/1998 |
| JP | 10-228661 | 8/1998 |
| JP | A 10-214783 | 8/1998 |
| JP | 10-255319 | 9/1998 |
| JP | 10-303114 | 11/1998 |
| JP | 10-340846 | 12/1998 |
| JP | A 11-135400 | 5/1999 |
| JP | 11-176727 | 7/1999 |
| JP | 2000-058436 | 2/2000 |
| JP | A 2000-505958 | 5/2000 |
| JP | 2001-015422 A | 1/2001 |
| JP | 2001-091849 | 4/2001 |
| JP | 2004-193252 | 7/2004 |
| JP | A-2005-109426 | 4/2005 |
| JP | A-2005-116571 | 4/2005 |
| JP | A-2005-129914 | 5/2005 |
| JP | A-2005-159322 | 6/2005 |
| JP | A-2005-183744 | 7/2005 |
| JP | 2005-294846 A | 10/2005 |
| JP | 2005-303167 A | 10/2005 |
| WO | WO 99/49504 | 9/1999 |
| WO | WO 01/35168 A1 | 5/2001 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/086468 A1 | 10/2004 |
| WO | WO 2004/090577 | 10/2004 |

| | | |
|---|---|---|
| WO | WO 2004/090633 | 10/2004 |
| WO | WO 2004/090634 A2 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/105106 A1 | 12/2004 |
| WO | WO 2004/107048 A2 | 12/2004 |
| WO | WO 2004/114380 A1 | 12/2004 |
| WO | WO 2005/003864 A2 | 1/2005 |
| WO | WO 2005/006417 A1 | 1/2005 |
| WO | WO 2005/010611 | 2/2005 |
| WO | WO 2005/024517 | 3/2005 |
| WO | WO 2005/024517 A2 | 3/2005 |
| WO | WO 2005/057635 A1 | 6/2005 |
| WO | 2005/093791 A1 | 10/2005 |
| WO | 2006/007111 A2 | 1/2006 |
| WO | WO 2006/007111 A2 | 1/2006 |
| WO | WO 2006/009573 A1 | 1/2006 |

OTHER PUBLICATIONS

M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion of Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numberical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", FUTURE FAB International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G Owen et al., "1/8 μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm Immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, "The $k_3$ coefficient in nonparaxial λ/NA scaling equations for resolution, depth of focus, and immersion lithography," *J. Microlith., Microfab., Microsyst.* 1(1):7-12 (2002).
European Search Report for European Patent Application No. 05253060.7, dated Aug. 21, 2005.
U.S. Appl. No. 10/831,370, filed Apr. 26, 2004, Derksen.
U.S. Appl. No. 10/873,647, filed Jun. 23, 2004, Cox et al.
U.S. Appl. No. 10/773,461, filed Feb. 9, 2004, Duineveld et al.
U.S. Appl. No. 10/698,012, filed Oct. 31, 2003, Flagello et al.
U.S. Appl. No. 10/705,804, filed Nov. 12, 2003, De Smit et al.
U.S. Appl. No. 10/705,805, filed Nov. 12, 2003, Lof et al.
U.S. Appl. No. 10/705,783, filed Nov. 12, 2003, Lof et al.
U.S. Appl. No. 10/743,271, filed Dec. 23, 2003, Van Santen et al.
U.S. Appl. No. 10/844,575, filed May 13, 2004, Streefkerk.
U.S. Appl. No. 10/705,785, filed Nov. 12, 2003, Derksen et al.
U.S. Appl. No. 10/724,402, filed Dec. 1, 2003, Simon et al.
U.S. Appl. No. 10/715,116, filed Nov. 18, 2003, Bleeker.
U.S. Appl. No. 10/719,683, filed Nov. 24, 2003, Streefkerk et al.
U.S. Appl. No. 10/705,816, filed Nov. 12, 2003, Lof et al.
U.S. Appl. No. 10/816,189, filed Apr. 2, 2004, Cox et al.
U.S. Appl. No. 10/857,614, filed Jun. 1, 2004, Lof et al.
U.S. Appl. No. 10/367,910, filed Feb. 19, 2003, Suwa et al.
Information Disclosure Statement filed Dec. 8, 2006 for U.S. Appl. No. 11/635,607.
English Translation of Japanese Official Action issued on Jul. 25, 2008 in Japanese Application No. 2005-147548.
R.D. Mih et al., "Using the focus monitor test mask to characterize lithographic performance", SPIE, vol. 2440, 1995, pp. 657-665.
T.A. Brunner et al., "Quantitative stepper metrology using the focus monitor test mask", SPIE, vol. 2197, 1994, pp. 541-549.
Notice of Allowance dated Sep. 29, 2008 in related U.S. Appl. No. 10/850,451.

* cited by examiner

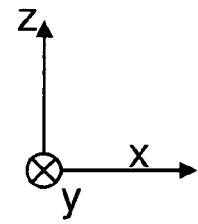
Fig. 6
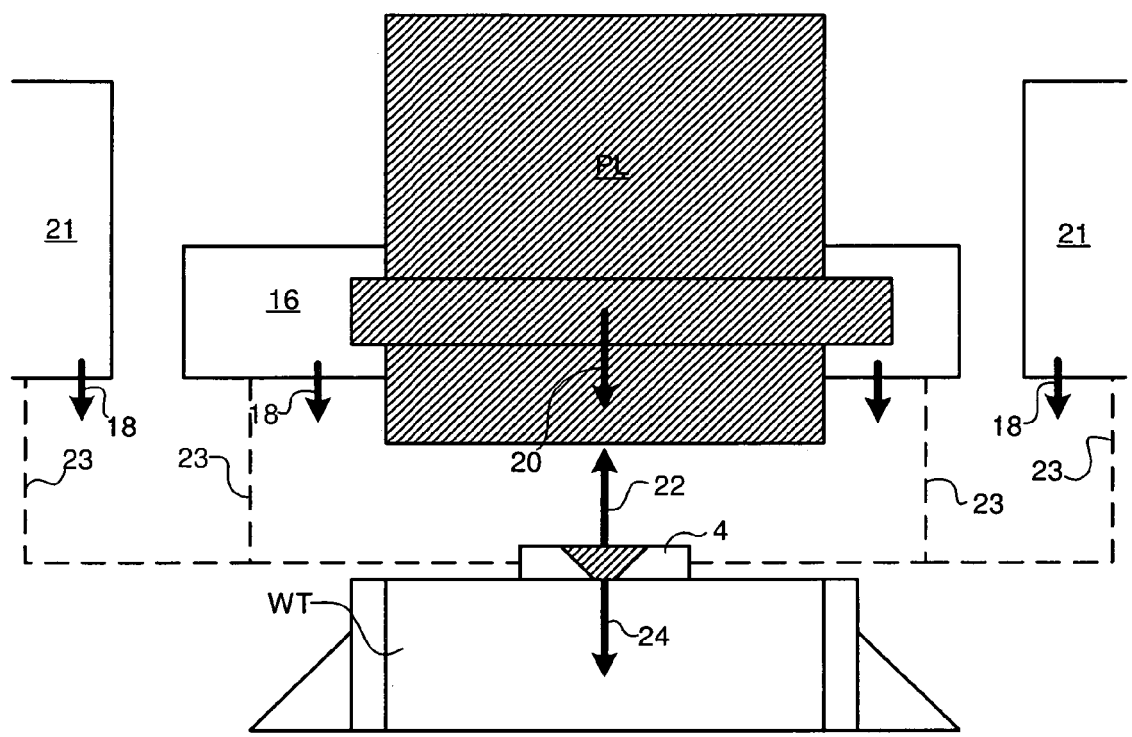

LITHOGRAPHIC APPARATUS AND DEVICE MANUFACTURING METHOD

CROSS REFERENCE TO RELATED APPLICATIONS

This application is a continuation-in-part of prior U.S. patent application Ser. No. 10/850,451, filed May 21, 2004, entitled, Lithographic Apparatus and Device Manufacturing Method, which application is incorporated herein in its entirety by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Introduction of an immersion liquid and an associated liquid supply system member to lithographic apparatus may cause deterioration in the accuracy of focus at the substrate and in the precision with which other parameters critical to imaging are controlled.

Accordingly, it would be advantageous, for example, to overcome these and other problems with a view to improving the performance of the lithographic apparatus.

According to an aspect of the invention, there is provided a lithographic apparatus comprising:

an illumination system arranged to condition a radiation beam;

a support structure configured to hold a patterning device, the patterning device being capable of imparting the radiation beam with a pattern in its cross-section, thus providing a patterned radiation beam;

a substrate table configured to hold a substrate;

a projection system arranged to project the patterned radiation beam onto a target portion of the substrate;

a liquid supply system member configured to contain a liquid in a space between the projection system and the substrate; and a liquid supply system member compensator arranged to compensate for an interaction between the liquid supply system member and the substrate table.

Without compensation, the weight of a liquid supply system member or other forces transmitted by the liquid supply system member on the substrate table may cause position dependent forces and torques on and non-negligible deformation and/or tilt of the substrate table. Parasitic stiffness effects arising from a guiding member attached to the liquid supply system member may cause similar effects. The defocus at the substrate caused by these disturbances may be up to 1000 nm. In addition to causing position dependent defocussing effects, these disturbances of the substrate table also may lead to machine to machine overlay errors (in particular between immersion and non-immersion machines). In a case where the additional weight of the liquid supply system member is compensated by a substrate table compensator, the effect of shifting gravity forces caused by the liquid supply system member may lead to cross-talk problems in the servo system controlling the position of the substrate table. A liquid supply system member compensator may reduce some or all of the problems described above by compensating for any gravity or other force induced effects between the liquid supply system member and substrate table.

The liquid supply system member compensator may comprise a focus calibration device configured to compensate a relative position of the substrate and a plane of best focus of the lithographic apparatus according to compensation data.

The focus calibration device enables compensation of the effects of the weight or other forces of the liquid supply system member without substantial physical interaction with the liquid supply system member itself. The compensation can be implemented, for example, using software controlling the relative position of the substrate table via either an interpolated matrix or as an analytical polynomial function, each mathematical construction representing the compensation that may be used to overcome the interaction-induced disturbance of the substrate table. The compensation will in general be a function of position in a direction perpendicular to the optical axis of the projection system and may be recorded in Cartesian or polar coordinates.

The compensation data may be derived from the output of a substrate table geometry measuring device configured to determine a surface height profile, a surface tilt profile, or both of the substrate table when disturbed by the interaction with the liquid supply system member, the surface height profile being defined in a direction substantially parallel to the optical axis of a final element of the projection system and the surface tilt profile being defined with respect to one or two orthogonal axes of a plane substantially perpendicular to the optical axis of the final element of the projection system. This approach may allow accurate characterization of any induced disturbance.

The compensation data may be derived from a mechanical mathematical model of the substrate table, which is arranged to forecast substrate table disturbance as a function of a position dependent applied force. This approach may allows compensation to be implemented with a minimum of additional measurements and/or measurement apparatus.

The compensation data maybe derived from an analysis of an exposed focus test pattern, arranged to reveal the extent of focus error as a function of position. This approach may provide accurate characterization without additional measurement components.

The exposed focus test pattern may be imaged on a reference lithography apparatus subjected to forces substantially equivalent to the interaction between the liquid supply system member and the substrate table. This approach may allow accurate characterization of disturbances due to the liquid supply system member without interfering with the main lithography apparatus. The reference apparatus may specialize in measuring the focus test pattern and therefore be simpler and more efficient for these measurements than the main lithography apparatus.

In a dual stage lithographic apparatus, the system focus is typically calibrated via a substrate map made without the immersion liquid and liquid supply system member being present. In such an arrangement, the bending effect is not taken into account, which causes de-focus effects to occur when imaging is carried out with the liquid supply system member in place.

The substrate table geometry measuring device may be configured to determine the surface height profile, the surface tilt profile, or both of the substrate table as a function of the position of the liquid supply system member relative to the substrate table in a plane substantially perpendicular to the optical axis of the final element of the projection system. This feature may take into account the fact that the disturbance at a point on the substrate table due to the interaction with the liquid supply system member is not in general a function only of the distance of the point from the liquid supply system member. Torques will depend on the position of forces relative to pivot axes and the local response to stresses may vary over the substrate table.

The liquid supply system member compensator may comprise a liquid supply system member suspension device capable of applying a force to the liquid supply system member to at least partially compensate for the interaction between the liquid supply system member and the substrate table. As an alternative to allowing the distortion and/or tilt to occur and compensating for their effects, this feature may make it possible to prevent disturbances occurring in the first place. This approach has a possible advantage of eliminating calibration measurements, which may be machine specific, have to be repeated and have a limited accuracy.

The liquid supply system member suspension device may be configured to couple to a frame supporting at least a part of the projection system, the frame being capable of supporting via the coupling at least a part of the reaction to the force applied by the liquid supply system member suspension device to the liquid supply system member. Although typically located further away from the liquid supply system member than the final element of the projection system, supporting the weight of the liquid supply system member directly by the frame holding the projection system may greatly reduce the possibility of any distortion or change in orientation of elements of the projection system.

The liquid supply system member suspension device may be configured to couple to the projection system, the projection system being capable of supporting via the coupling at least a part of the reaction to the force applied by the liquid supply system member suspension device to the liquid supply system member. An advantage of this arrangement is that the projection system is in very close proximity to the liquid supply system member, and may be sufficiently massive not to be significantly distorted by the additional weight or other forces of the liquid supply system member.

The liquid supply system member suspension device may be configured to couple to a frame that is substantially mechanically isolated from the projection system, the isolated frame being capable of supporting via the coupling at least part of the reaction force applied by the liquid supply system member suspension device to the liquid supply system member. This arrangement has the advantage of minimizing the possibility of any distortion or change in orientation of elements of the projection system. "Substantially mechanically isolated from" may mean, for example, not in direct mechanical contact with or not in close mechanical contact with (i.e. any mechanical link is made only by means of a substantial number of intermediate connections, or a passive or active bearing, for example). For example, the isolated frame may be a machine base frame, configured to support major components of the lithography apparatus via bearings. The machine base frame may be massive enough and sufficiently well isolated from the outside world to ensure that vibrations and other disturbances from the outside world are not transmitted to the liquid supply system member. A coupling based on Lorentz actuators (using electromagnetic forces) may be particularly suitable for this embodiment as it avoids the need for direct mechanical contact between the isolated frame and the liquid supply system member, which might otherwise require precise alignment and expensive manufacturing tolerances to realize.

The lithographic apparatus may comprise a liquid supply system member suspension device controller configured to apply a control force to the liquid supply system member, via the liquid supply system member suspension device, according to data representing the magnitude of the interaction between the liquid supply system member and the substrate table. This arrangement may provide a flexible and efficient way to compensate for forces arising between a liquid supply system member and the substrate table. It may easily be adapted for different combinations of liquid supply system member and substrate table and different environmental conditions.

The interaction discussed above may arise due to the weight of the liquid supply system member acting on the substrate table. External forces, however, arising from elements other than the liquid supply system member may also play a role. These forces may be static, like the weight of the liquid supply system member, or dynamic (time-varying). Examples of time-varying forces may be those that arise due to stray magnetic fields. Also, the interaction may be position dependent, with a size and distribution within the liquid supply system member that depends on the position of the liquid supply system member. This may occur, for example, for electromagnetically mediated forces as the position of the liquid supply system member relative to other components of the lithography apparatus is varied.

The lithographic apparatus may comprise a liquid supply system member suspension device controller and a liquid supply system member position determining device, the liquid supply system member suspension device controller being configured to apply a control force to the liquid supply system member, via the liquid supply system member suspension device, based on a position of the liquid supply system member as measured by the liquid supply system member position determining device. This arrangement may provide a direct means for dealing with forces that may be exerted on the liquid supply system member by the liquid supply system member, such as a vertical guide member, which may be a known function of the position of the liquid supply system member. In other words, the interaction may be liquid supply system member position dependent, with a size and distribution within the liquid supply system member that depends on the position of the liquid supply system member. This may occur, for example, with electromagnetically mediated forces as the position of the liquid supply system member relative to electrically active components of the lithographic apparatus is varied.

The liquid supply system member position determining device may determine a position of the liquid supply system member along an axis substantially parallel to the optical axis of the projection system, relative to the projection system, a frame supporting at least a part of the projection system, or a frame substantially mechanically isolated from the projection system but which supports the reaction to the force applied by the liquid supply system member suspension device to the liquid supply system member.

The liquid supply system member position determining device may determine a position of the liquid supply system member in a direction substantially perpendicular to the optical axis of the projection system.

The control force may be applied so as to compensate for forces arising from a liquid supply system member guiding member attached between the liquid supply system member and a frame supporting at least a part of the projection system.

The lithographic apparatus may comprise a substrate table force compensator configured to determine the magnitude of the interaction between the liquid supply system member and the substrate table and transmit data representing the magnitude to the liquid supply system member suspension device. The substrate table force compensator generates forces on the substrate table to keep the substrate table at a desired position (the substrate table motors may also be arranged to operate in a similar way). These control forces are a function of the position of the substrate table with respect to the projection system or frame supporting at least a part of the projection system. A control loop may be provided to ensure that this separation remains substantially constant. When a liquid supply system member is added to the substrate table, the actuating force maintaining the substrate table at the desired separation from the frame should be increased in order to compensate the interaction between the liquid supply system member and the substrate table (such as that due to the weight of the liquid supply system member). Although these interactions are compensated by the substrate table force compensator, because the actuator operates on the entire substrate table, it does not reduce the disturbances induced in the substrate table. However, according to an embodiment, the information concerning the additional forces associated with the liquid supply system member may be forwarded to the liquid supply system member suspension device, which may use this information independently to compensate for the forces arising from the liquid supply system member by applying an opposing force equal in magnitude to the weight (or other forces) of the liquid supply system member. As well as possibly achieving an advantage discussed above associated with preventing disturbances to the substrate table, this arrangement may also improve the stability of the low-frequency frame mountings supporting at least a part of the projection system. Without the liquid supply system member suspension device, the low-frequency frame mountings may experience the mass of the projection system and frame with and without the liquid supply system member. During lowering of the liquid supply system member to the substrate, the low-frequency frame mountings may be disturbed because the weight of the liquid supply system member is suddenly absent. When raising the liquid supply system member, the opposite occurs. The disturbances caused by the above effects may be dealt with by providing a settling time for the system to return to an equilibrium state. By removing the cause of the disturbances and therefore such settling times, it may be possible to improve the throughput of the lithography apparatus.

Using the control loop associated with the substrate table force compensator has a possible advantage of being active in the sense that the compensating force applied by the liquid supply system member suspension device does not have to be fixed in advance and may respond to variations in the effective weight of the liquid supply system member over time, at different locations in the world, or if the liquid supply system member guiding has some offset forces or parasitic stiffness.

The liquid supply system member suspension device may operate by means of at least one mechanism selected from the following list: an electromagnetic force using the Lorentz principle, an electromagnetic force using the reluctance principle, a bellows, and a mechanical spring. The electromagnetic force may be a passive magnetic force, for example. The bellows may operate by means of fluid, either gaseous or liquid. The mechanical spring may be constructed from an elastic material such as a metal. In each case, a suitable damping component may be incorporated into the suspension device so that it may achieve desired performance characteristics. An example of a device capable of providing a compensation force in combination with a damper is a bellows with a certain volume in combination with a gas restriction.

The liquid supply system member suspension device may be configured to lift the liquid supply system member clear of the substrate table for substrate table exchange. Normally, a separate device is used to perform this operation. By adapting the liquid supply system member compensator to perform this function, it may possible to reduce the number of components making up the lithography apparatus.

The liquid supply system member suspension device may be configured to position the liquid supply system member clear of the substrate table in a distal safety position in response to a system failure. A possibility for substrate table exchange is raising the liquid supply system member by using bellows or any other lifting mechanism. These bellows may be arranged to raise the liquid supply system member in response to certain modes of system failure. For other modes of failure, the bellows themselves may fail (such as when the pressurised gas driving the bellows fails). Using a liquid supply system member suspension device as a safety device in the event of system failure has a possible advantage of reducing the number of system components, but also of providing a more comprehensive safety feature, which may be designed to lift the liquid supply system member clear for any system failure.

The lithographic apparatus may comprise a liquid supply system member suspension device that comprises:

a housing comprising a pressure medium;

a first piston slidably engaged within a first wall of the housing nearest the liquid supply system member, and coupled to the liquid supply system member;

a second piston, forced towards the first piston by a pre-tensioned spring, and slidably engaged within a second wall of the housing opposite the first wall; and a pressure regulator configured to control the pressure within the housing, the pressure acting to apply a force to the first piston in a direction substantially parallel to the optical axis of the projection system and directed towards the liquid supply system member, and apply a force in the opposite direction to the second piston, wherein, in a normal operating mode, the first and second pistons are arranged to interact with each other, the pressure regulator being arranged to control the vertical position of the liquid supply system member by varying the pressure within the housing;

at pressures within the housing below a lower threshold pressure, the pre-tension in the spring is arranged to dominate the motion of the second piston, which forces the first piston and the liquid supply system member into a safety position clear of the substrate table; and at pressures within the housing above an upper threshold pressure, the pressure medium force is arranged to dominate and forces the first piston clear of the second piston and the liquid supply system member into a safety position clear of the substrate table. This feature may provide a reliable and controllable way for regulating the position of the liquid supply system member via a pressure regulator, in such a way that the liquid supply system member is transferred to a safety position when the pressure provided by the pressure regulator falls outside of safety margins defined by upper and lower pressure thresholds.

According to a further aspect of the invention, there is provided a device manufacturing method comprising:

containing a liquid in a space between a projection system of a lithographic apparatus and a substrate table using a liquid supply system member;

compensating for an interaction between the liquid supply system member and the substrate table; and projecting a patterned radiation beam through the liquid onto a target portion of the substrate using the projection system.

According to a further aspect of the invention, there is a lithographic apparatus focus calibration method, comprising:

containing a liquid in a space between a projection system of a lithography apparatus and a substrate table of the lithography apparatus using a liquid supply system member;

determining a surface height profile, a surface tilt profile, or both of the substrate table when disturbed by an interaction with the liquid supply system member, the surface height profile being defined in a direction substantially parallel to the optical axis of a final element of the projection system and the surface tilt profile being defined with respect to one or two orthogonal axes of a plane substantially perpendicular to the optical axis of the final element of the projection system; and determining compensation data to compensate the relative position of the substrate and the plane of best focus of the lithography apparatus.

According to a further aspect of the invention, there is provided a lithographic apparatus focus calibration method, comprising:

projecting a radiation beam imparted with a focus test pattern, through a liquid, onto a target portion of a substrate, using a projection system of a lithography apparatus;

analyzing the projected focus test pattern on the substrate to determine focus error at a plurality of positions;

determining compensation data to compensate the relative position of the substrate and the plane of best focus of the lithography apparatus.

According to a further aspect, there is provided a lithographic apparatus, comprising:

a substrate table configured to hold a substrate;

a projection system arranged to project a patterned beam of radiation onto a target portion of the substrate;

a liquid supply system member configured to contain a liquid in a space between the projection system and the substrate; and a liquid supply system member compensator configured to apply a force to the liquid supply system member to at least partially compensate for an interaction between the liquid supply system member and the substrate table and coupled to a frame that is substantially mechanically isolated from the projection system, the isolated frame capable of supporting at least part of a reaction to a force applied by the liquid supply system member compensator to the liquid supply system member.

According to a further aspect, there is provided a lithographic apparatus, comprising:

a substrate table configured to hold a substrate;

a projection system arranged to project a patterned beam of radiation onto a target portion of the substrate;

a liquid supply system member configured to contain a liquid in a space between the projection system and the substrate; and a liquid supply system member compensator configured to compensate for a force exerted by the liquid supply system member toward the substrate table.

According to a further aspect, there is provided a device manufacturing method, comprising:

containing a liquid in a space between a projection system of a lithographic apparatus and a substrate table using a liquid supply system member;

compensating for an interaction between the liquid supply system member and the substrate table by using a liquid supply system member compensator coupled to a frame that is substantially mechanically isolated from the projection system; and projecting a patterned radiation beam through the liquid onto a target portion of the substrate using the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion liquid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 depicts embodiments of the invention wherein the seal member is supported by a suspension device in mechanical contact with either the projection system or the frame supporting the projection system;

DETAILED DESCRIPTION

Figure 1:
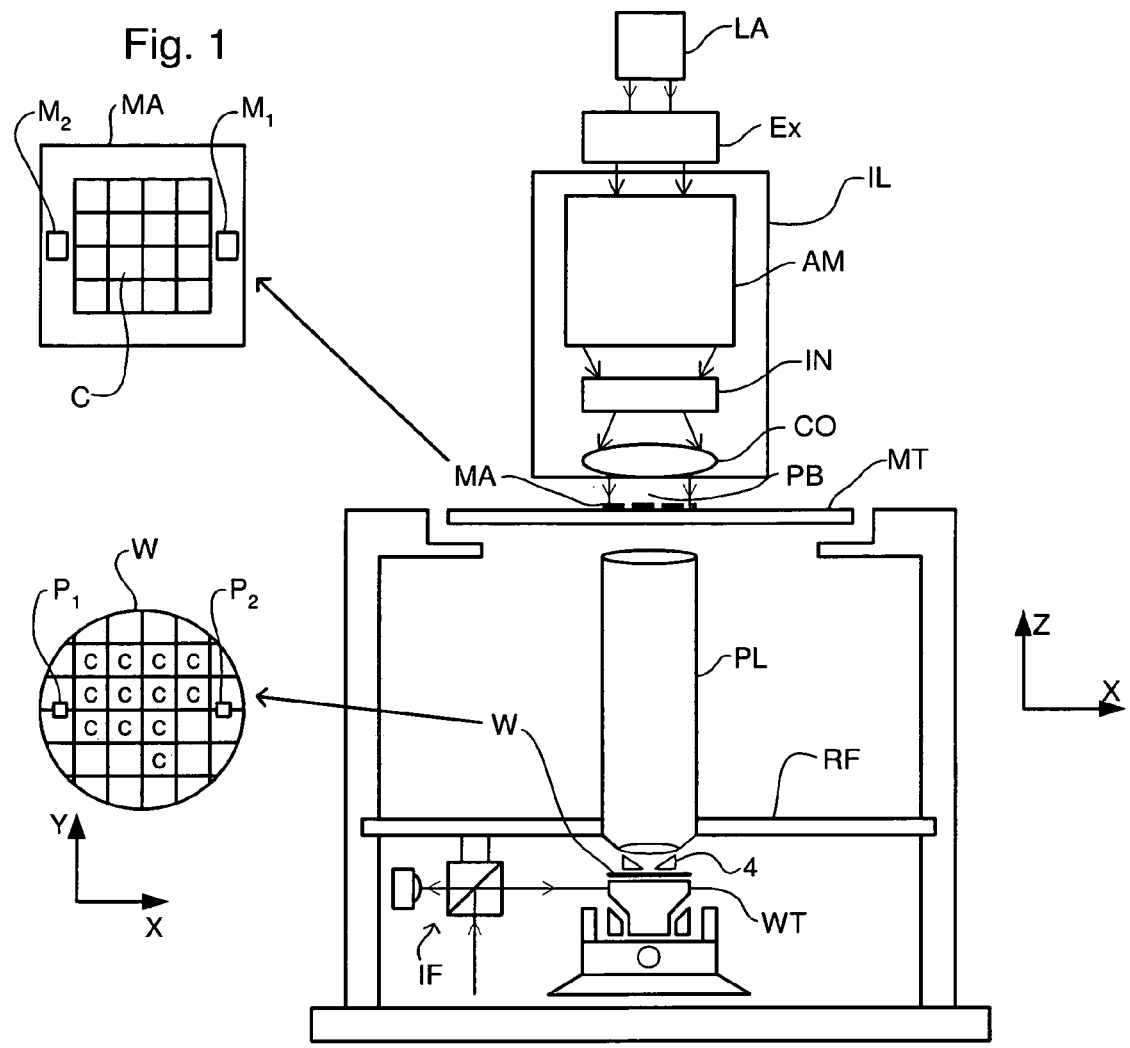
FIG. 1 depicts a lithographic apparatus according to an embodiment of the invention.
Figure 2:
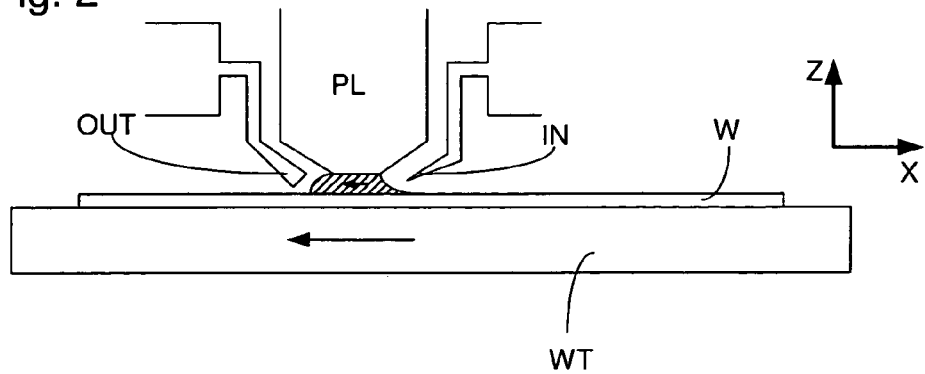
FIG. 2 depicts a liquid supply system for supplying liquid to a space between the projection system and the substrate according to an embodiment of the invention.
Figure 3:
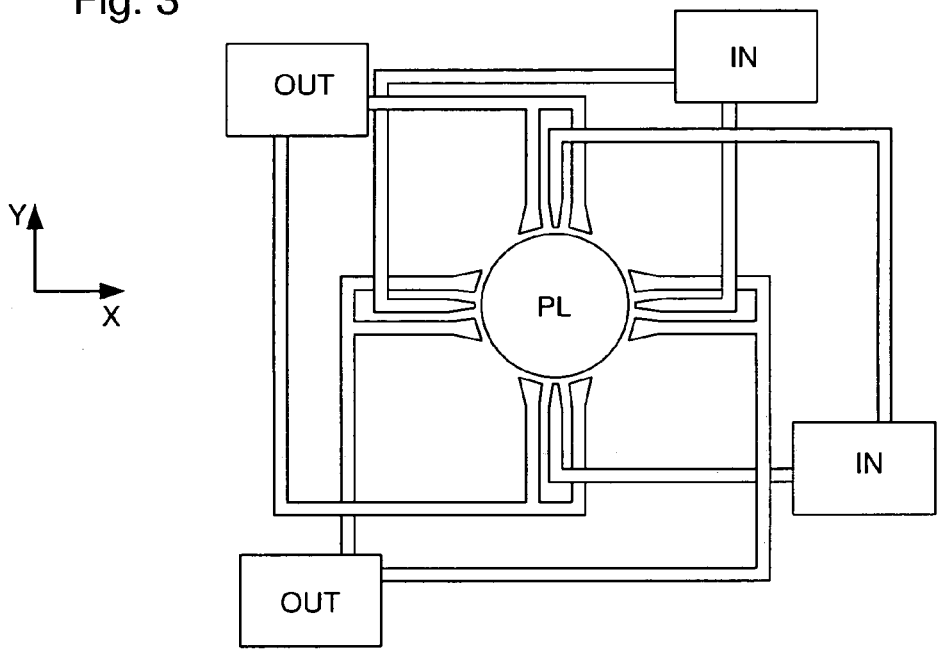
FIG. 3 depicts the arrangement of inlets and outlets of the liquid supply system of FIG. 2 around the final element of the projection system according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation or EUV radiation).

a support structure (e.g. a mask table) MT for supporting a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the projection beam PB. Similarly, the first positioning device PM and another position sensor (which is not explicitly depicted in FIG. 1) can be used to accurately position the mask MA with respect to the path of the projection beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Another immersion lithography solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an implementation, the seal is a contactless seal such as a gas seal. Such a system is disclosed in, for example, United States patent application no. U.S. Ser. No. 10/705,783, hereby incorporated in its entirety by reference.

Figure 5:
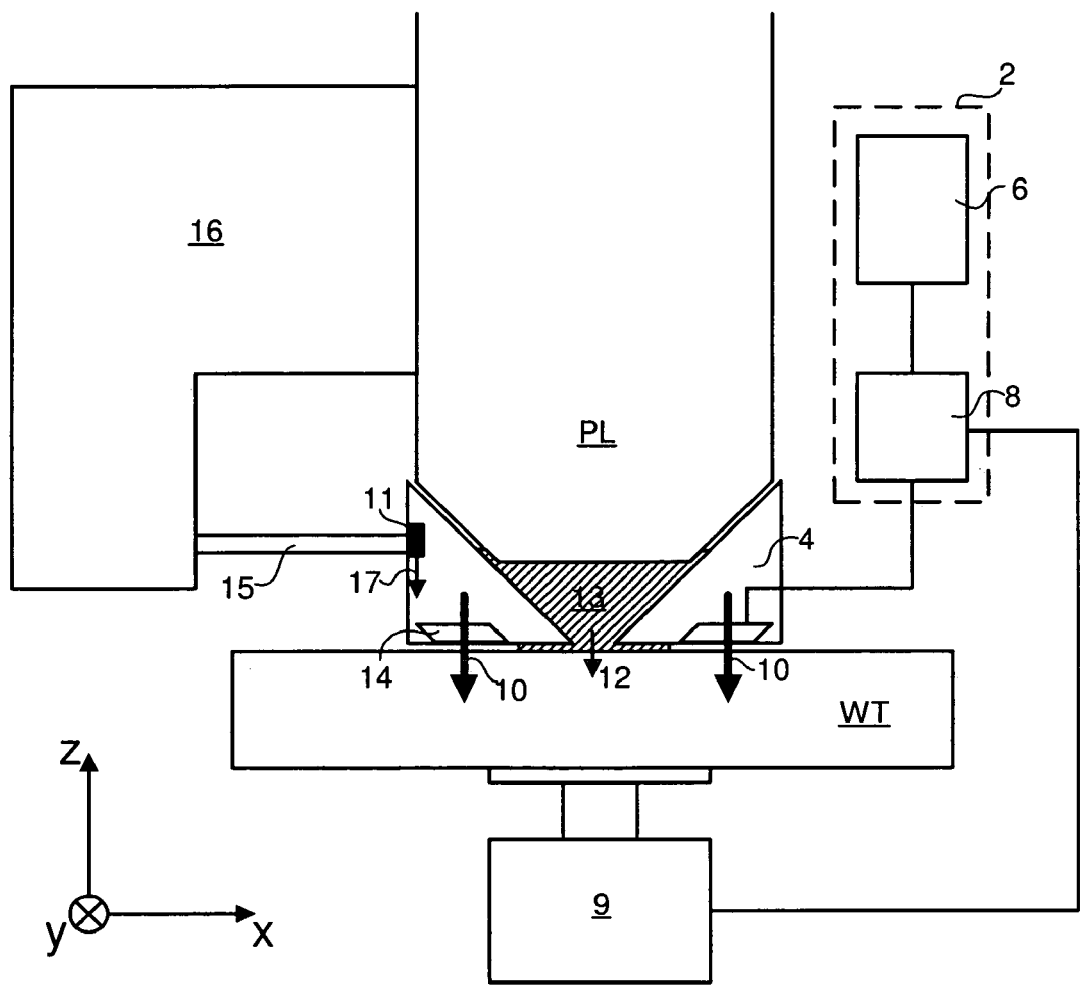
FIG. 5 depicts a projection system interacting with a substrate table geometry measuring device, calibration data storage device and focus calibration device according to an embodiment of the invention.

FIG. 5 depicts a seal member compensator 2 comprising a focus calibration device 6 and data storage device 8 according to an embodiment of the invention. In the arrangement shown, seal member 4 contains immersion liquid 13 in the region between the final element of the projection system PL and the substrate W and/or substrate table WT. The weight of, as well as other forces transmitted by, the seal member 4, if uncompensated, may cause deformation and/or tilt of the substrate table WT. The force distribution from the seal member 4 is non-uniform in the plane perpendicular to the optical axis of the final element of the projection system PL. In the coordinate system shown in FIG. 5, which is also relevant to the other Figures, this plane corresponds to the XY plane and the optical axis of the final element of the projection system PL corresponds to the Z-axis. For example, the non-uniformity of the gravity forces acting on the substrate table WT due to the seal member 4 are indicated by arrows 10 and 12, larger arrows indicating larger forces. Vertical guide members 15 attached between the seal member 4 and a frame 16 supporting the final element of the projection system PL, may also transmit forces via anchor points 11, as indicated by arrows 17. In general, the disturbances suffered by the substrate table WT arise from a complex distribution of forces and torques caused by the seal member 4 and will depend on the relative position of the seal member 4 with respect to the substrate table WT. Without compensation, these forces may lead to de-focus effects when a substrate W on the substrate table WT is exposed. For example, in a dual stage lithographic apparatus, wherein a geometrical map of the substrate W is made under a separate measurement system before the substrate table WT is positioned beneath the projection system PL with the seal member 4 and immersion liquid 14 in place, the geometrical substrate map may be in error since the seal member 4 was not in place while the substrate map was being made. The distortion of the substrate table WT due to forces from the seal member 4 may not only cause de-focus at the substrate W but may also affect machine to machine overlay (in particular immersion versus non-immersion) and may also affect the accuracy of the positioning of the substrate table WT, which is adjusted according to measurements made by an interferometer operating by reflecting light from lateral reflective side regions of the substrate table WT.

According to an embodiment, disturbances of the substrate table WT, such as bending under the weight of the seal member 4, can be compensated for by calibration of the effect. A substrate table geometry measuring device 14 is provided to determine the surface height profile of the substrate table WT when it is being deformed and/or tilted by interaction with the seal member 4. The surface height profile is the position of the surface as measured along the Z-axis as a function of position in the XY plane, and corresponds to the geometrical substrate map as may be recorded at the measuring position in a dual stage lithographic apparatus. Measurements of the surface height profile carried out by the substrate table geometry measuring device 14 should be repeated for different positions of the seal member 4 relative to the substrate table WT. Similarly, the surface tilt profile of the substrate table WT may be determined, the surface tilt profile including the Rx and/or Ry tilt of the surface as a function of position in the XY plane The results of the measurements are stored in a data storage device 8, which is accessible by the focus calibration device 6. Based on the current horizontal position of the seal member 4 relative to the substrate table WT, the focus calibration device 6 calculates compensation data to transmit to a substrate table servo system 9, capable of adjusting the position (e.g., height and/or tilt) of the substrate table WT in order to compensate for de-focus effects arising from distortion. The focus calibration device 6 effectively aims to bring each point on the substrate W to the plane of best focus at the point of imaging. In practice, the focus calibration device 6 may be implemented in software arranged to run on a suitably programmed computer.

The disturbance of the substrate table WT may be modelled as an analytical mathematical function, $Z_{comp}=Z(X,Y)$, which may comprise a polynomial function or power series expansion. For example, the following function may be used: $Z=aX+bY+cY^2+\ldots+uX^2Y^2+vX^4+wY^4+f(X,Y)$, where $f(X,Y)$ represents the residuals not covered in the rest of the power series. Tilts around the X and Y axes are calculated by differentiating the power series. A preference for a function in terms of X and Y coordinates may occur if the effect is not circularly symmetric, due to the geometry of the relevant elements of the substrate table (such as the support structure of the substrate table). In the case where the geometry tends towards triangular, a Zernike series of coefficients would be favored. The coefficients and residual function in $Z_{comp}$ may be determined from one or more of the following: a) a mechanical mathematical model of the substrate table, which forecasts the substrate table disturbance (deformation and/or tilt) as a function of the position of the seal member and the interaction force; b) calibration results from a test exposing a focus test pattern, from which the focus error at the exposed position can be determined; c) using the measured results from b) in a reference machine with an equivalent force applied to the substrate table as that applied by the seal member in the actual lithographic apparatus to be compensated; or d) a combination of one or more of a), b) and c).

The substrate table may also be deformed after the substrate is attached to it if the substrate and/or substrate table changes temperature. This may be dealt with using a feedforward mechanism based on a compensation function as discussed above or, alternatively, using a feedback mechanism with one or more temperature sensors arranged within the substrate table.

As an alternative to altering the performance of the projection system itself in order to take account of the disturbance of the substrate table WT, a further embodiment of the seal member compensator operates by physically supporting the seal member 4 and thereby preventing the associated distortion of the substrate table WT at source. FIG. 6 depicts possible embodiments according to this aspect of the invention. Arrow 24 represents a downward force acting on the seal member 4, which may be a force of gravity due to its weight. The equal and opposite supporting force supplied by a seal member compensator is indicated by arrow 22. In order to supply such a force, the seal member compensator must couple (mechanically or otherwise) to an element solid enough that no disadvantageous distortions will occur due to the additional force from the seal member 4. One way in which this may be achieved is by coupling the seal member 4 to a frame supporting the projection system PL (which frame may support various metrology devices, such as a focus sensor and/or alignment sensor). The resulting forces are indicated by arrows 18 and the coupling itself by broken lines 23. In this embodiment, the coupling 23 may be made to either or both of a frame 16 supporting the projection system PL and an isolated frame 21, which has no direct or close mechanical connection to the substrate table WT or projection system PL. This arrangement has the advantage of minimizing disturbance of delicate elements of the projection system PL. As an alternative, however, it may be possible to arrange some form of coupling with the final element of the projection system PL. The resulting downwards force is illustrated by arrow 20. This arrangement has an advantage in that the projection system PL is in close proximity to the seal member 4 but care must be taken not to affect the optical performance of the projection system PL.

Figure 7:
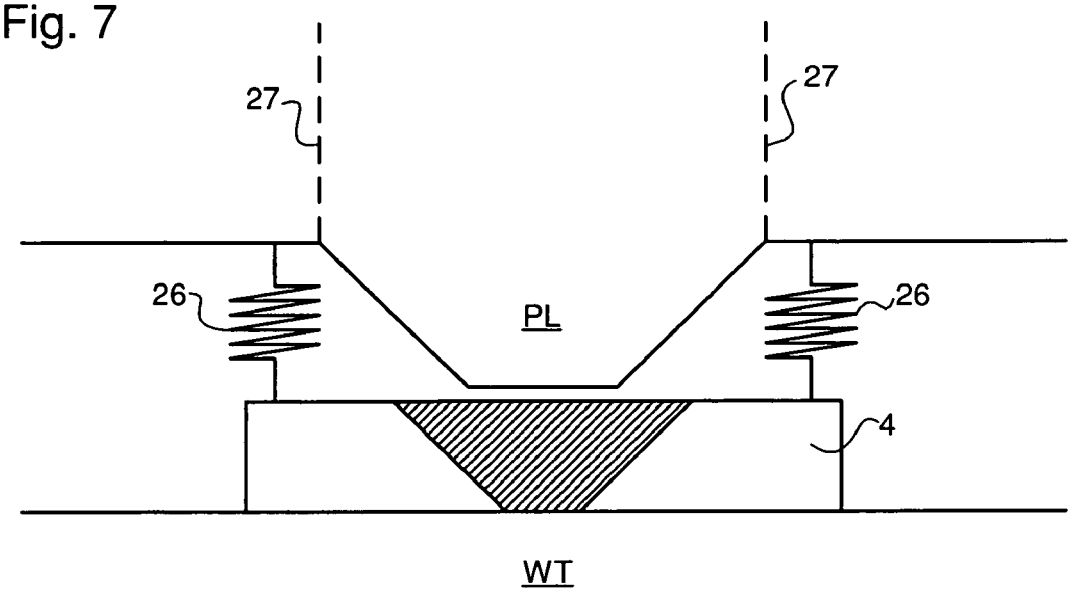
FIG. 7 depicts an embodiment of the seal member suspension device comprising mechanical springs.
Figure 8:
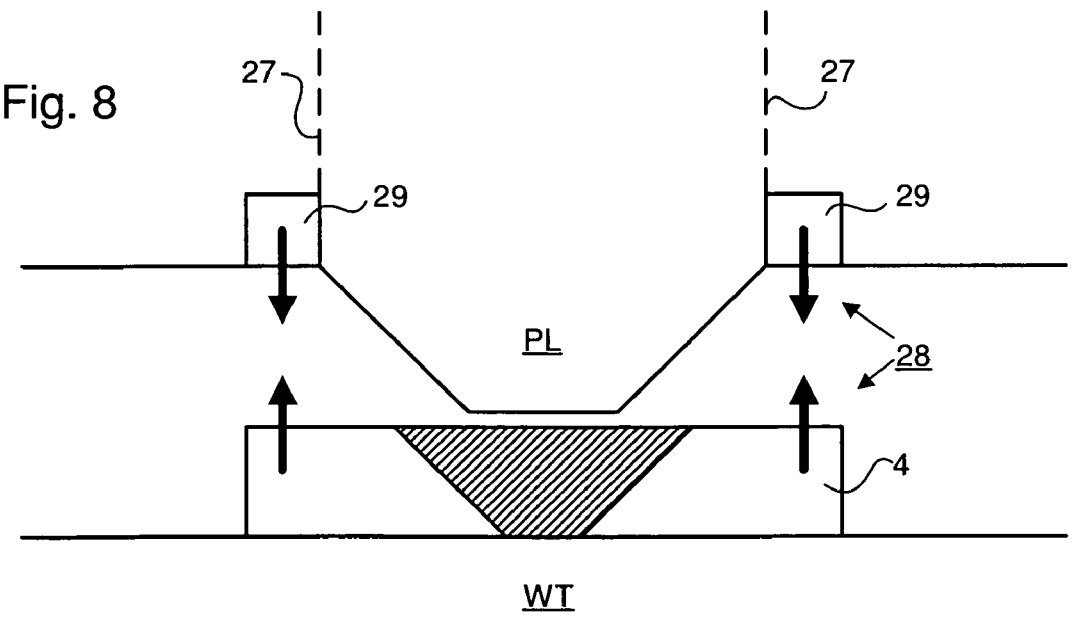
FIG. 8 depicts an embodiment of the seal member suspension device wherein the lifting force applied to the seal member is a passive magnetic force.

FIGS. 7 and 8 illustrate in more detail how the seal member 4 may in fact be supported by a seal member suspension device 26, 28 forming part of the seal member compensator. The compensation force can, for example, be a soft mechanical pre-loaded spring, a soft pneumatic bellow and/or a passive magnetic force. FIG. 7 shows an embodiment of the seal member suspension device 26 wherein the compensation force is of a general mechanical type, such as a spring. In the case where bellows are used as a mechanical seal member suspension device 26, the bellows medium may be either a liquid or a gas. FIG. 8 shows an embodiment of the seal member suspension device 28 wherein the compensation force is provided via electromagnetic Lorentz or reluctance actuators 29, which may exert a force on the seal member 4 without mechanical contact being made. In general, some form of damping force, perhaps proportional to the rate of change of displacement of the seal member with respect to time, may also be used in order to avoid abrupt displacement of the seal member 4, oscillation of the seal member 4, or, more generally, to achieve a desired response characteristic. In both FIGS. 7 and 8, broken lines 27 indicate that the reaction of the force applied to the seal member 4 may be supported via a portion of the projection system PL, a frame supporting the projection system PL, or a frame substantially mechanically isolated from the projection system PL and substrate table WT or any combination thereof.

Figure 9:
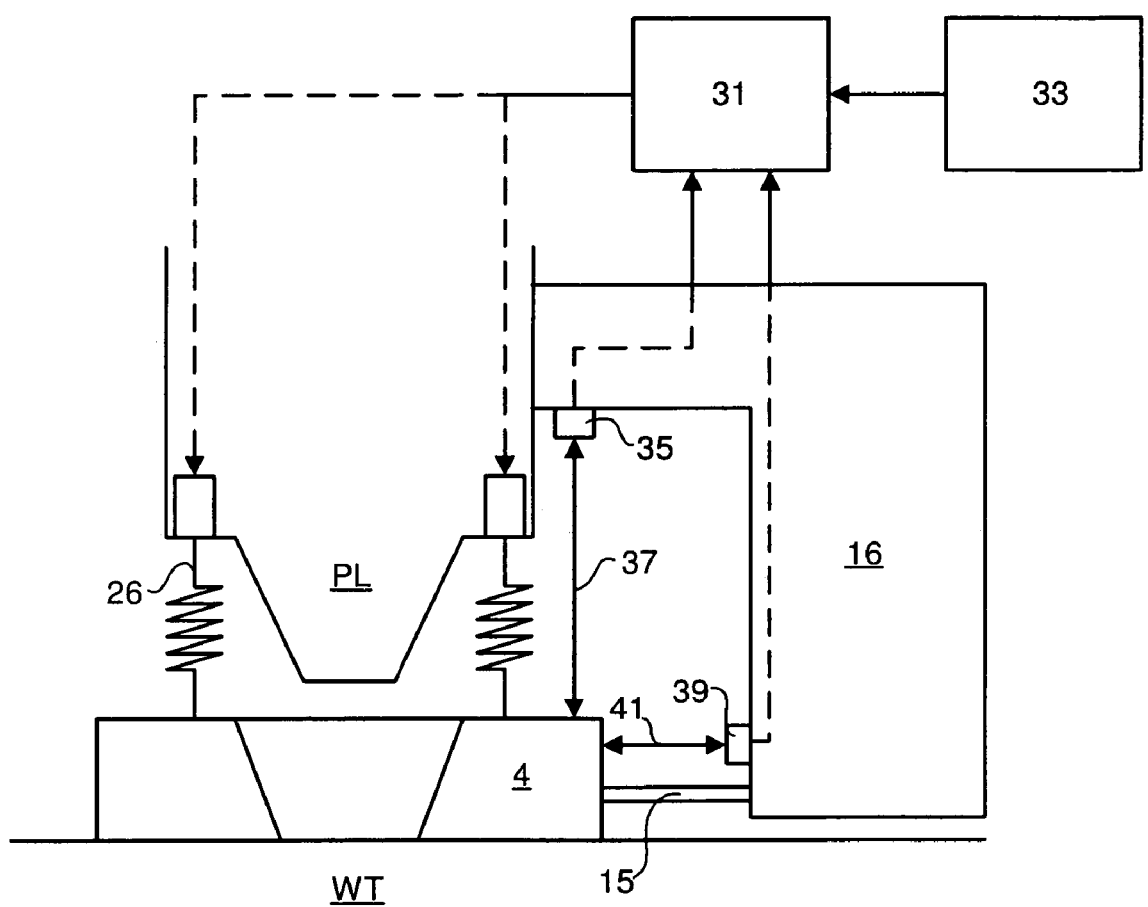
FIG. 9 depicts an embodiment of the invention comprising a seal member suspension device controller and a seal member suspension device controller memory.

FIG. 9 shows an embodiment of the invention comprising a seal member suspension device controller 31 and a seal member suspension device controller memory 33. The seal member suspension device controller 31 is here configured to control the magnitude of a compensation force applied to the seal member 4 via seal member suspension device 26 (although it may equally be seal member suspension device 28 or some combination). In order to determine an effective magnitude of the compensation force, the seal member suspension device controller 31 may use input from various sources. One possibility is simply to store a compensation value in a seal member suspension device controller memory 33, accessible by the seal memory suspension device controller 31. The stored compensation value may represent, for example, the weight of the seal member 4, a force applied via vertical guide members 15, and/or the size of some other force known to be acting on the seal member 4.

The seal memory suspension device controller 31 may also receive input from position sensors 35 and/or 39, which are arranged to measure the vertical and horizontal positions respectively of the seal member 4, as indicated schematically by arrows 37 and 41 respectively. In an implementation, the position sensors 35 and 39 are connected to the frame 16 supporting the projection system PL although either or both of them may be connected to another part of the lithographic apparatus. Using data stored in the seal member suspension device controller memory 33, for example, the vertical position of the seal member 4 may be used to calculate the size of forces exerted by the vertical guide members 15. Alternatively or additionally, where the forces acting on the seal member 4 depend on its horizontal position (i.e. the position in the X-Y plane), the output from sensor 39 (which could comprise two or more sensors in order to determine both X and Y coordinates), is used as input to the seal member suspension device controller 31. Of course, other positions, such as tilts, of the seal member may be measured and used. As before, the compensation force to apply may be calculated based on data stored in the seal member suspension device controller memory 33 describing the position dependence of the force acting on the seal member 4. This data may be derived from calculation or from calibration measurements.

Figure 10:
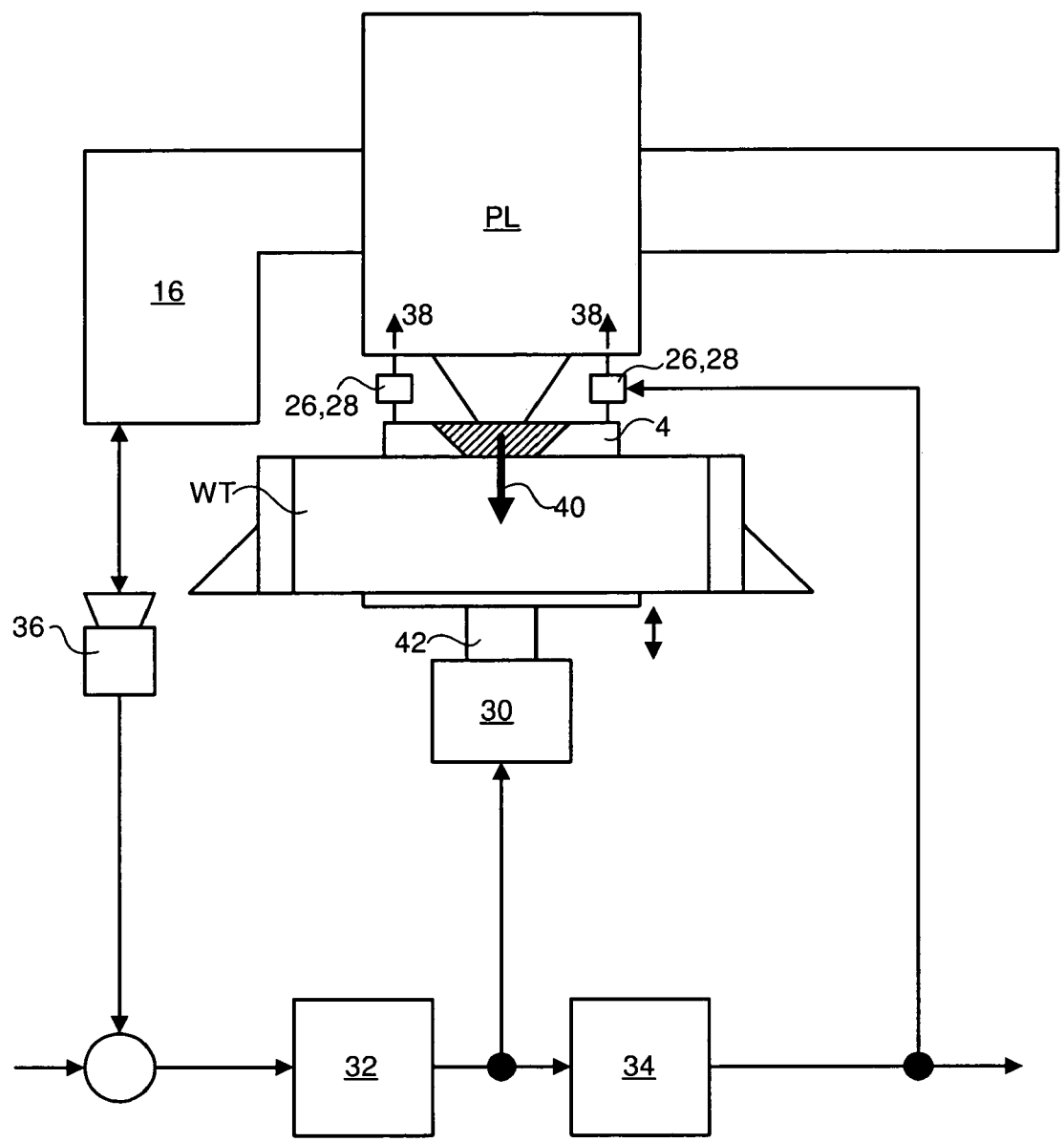
FIG. 10 depicts the seal member compensator arranged so as to interact with a control loop associated with a substrate table compensator according to an embodiment of the invention.

According to an embodiment of the invention, depicted in FIG. 10, an accurate compensation may be achieved using a seal member suspension device 26, 28 that is controlled as a function of the vertical force provided by a Z-actuator 42 of a substrate table compensator 30. In a normal (i.e. non-immersion) operation, the weight of the substrate table WT may be compensated by a control circuit forming part of the substrate table compensator 30, which acts to control the vertical and/or tilt (i.e. Z, Rx and/or Ry) position of the substrate table WT, by reference for example to a spatial separation between the frame 16 and the substrate table WT as measured by a sensor 36. If the seal member 4 is lowered and bears on the substrate table WT, an extra vertical force to counteract the weight of the seal member will be generated by a substrate table controller 32 (e.g. a PID low pass controller), forming part of the control circuit. Arrows 38 represent the applied forces opposing the weight of the seal member 4 indicated by arrow 40.

According to the present embodiment, the extra vertical force forms the input (i.e. set-point) for a seal member controller 34 (e.g. a PI low pass controller), forming part of the seal member compensator driving the seal member suspension device 26, 28, which may connect the seal member 4 and the frame 16 supporting the final element of the projection system PL (or, alternatively, connected the seal member 4 and the final element of the projection system PL itself). The seal member controller 34 generates a vertical force that will lift and/or tilt the seal member 4. The substrate table actuator 42 will no longer have to generate a compensation force in respect of the seal member 4 because this is provided by the seal member suspension device 26, 28. As in previous embodiments, the substrate table WT may no longer be deformed and/or tilted by the weight of the seal member 4, or from other forces arising from the seal member 4.

An accuracy of 1.0% is very feasible using compensation according to the above embodiment. In the case where the de-focus error is 400 nm, the error is reduced to approximately 4 nm or less, which should be acceptable for most purposes. The expected substrate table deformation and/or tilt becomes negligible under these circumstances, resulting in good machine to machine overlay. A further advantage is that the cross-talk in a substrate table short stroke actuator system, which is responsible for positioning the substrate table WT in the X, Y and Z directions, and for controlling substrate table WT tilt, becomes very small because the effect of shifting gravity forces, associated with variations in the effective weight of the seal member 4 and with variations in the position of the seal member 4 with respect to the substrate table WT, no longer occurs. The result is a more accurate stage positioning.

The seal member suspension device 26, 28 may be arranged, according to a further embodiment of the invention, to combine the functions of supporting the seal member 4 for the purposes of avoiding deformation and/or tilt of the substrate table WT with supporting the seal member 4 in a safe, normally raised, position for the purposes of exchanging the substrate table WT, or elements thereof, and/or for faithfully reacting to emergencies such as disconnected hoses in pressurised gas systems, power supply failures, or emergencies caused by the substrate table WT itself. As will be understood, the seal member suspension device 26, 28 may also simply be arranged to support the seal member 4 in a safe, normally raised, position for the purposes of exchanging the substrate table WT, or elements thereof and/or to provide a safety mechanism in case of system failure as described.

Figure 11:
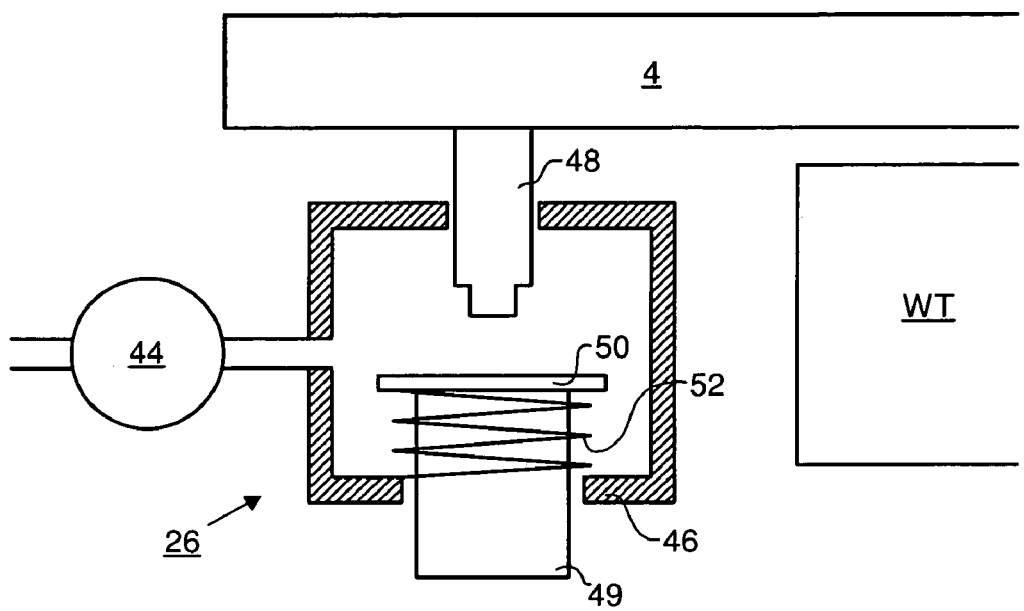
FIG. 11 depicts the seal member suspension device arranged to be capable of lifting the seal member clear of the substrate table for substrate table exchange and/or for positioning the seal member clear of the substrate table in a distal safety position in response to a system failure.

The arrangement is depicted in FIG. 11. Here, an embodiment of the seal member suspension device 26 comprises a housing 46, into which are inserted, in a sealed manner, a small piston 48 and a large piston 49. A pressure plate 50 is positioned on the uppermost surface of large piston 49. A spring member 52 is positioned between the pressure plate 50 and the lower inside surface of the housing 46 and is arranged to exert an upwards force on the large piston 49, which increases in magnitude as the distance between the lower inside surface of the housing 46 and the pressure plate 50 decreases. A pressure regulator 44 is provided to control the pressure within the volume delimited by the housing 46. Control of the pressure in the housing 46 via the pressure regulator 44 provides a means to control the vertical position of the seal member 4 and may be used in conjunction with the embodiments described above to compensate for forces arising from the seal member 4 and prevent distortion to the substrate table WT arising therefrom and/or to support the seal member 4 in a safe, normally raised, position for the purposes of exchanging the substrate table WT, or elements thereof. However, this arrangement may also fulfil the function of providing a safety mechanism in case of system failure, as is described below with reference to FIG. 12.

Figure 12:
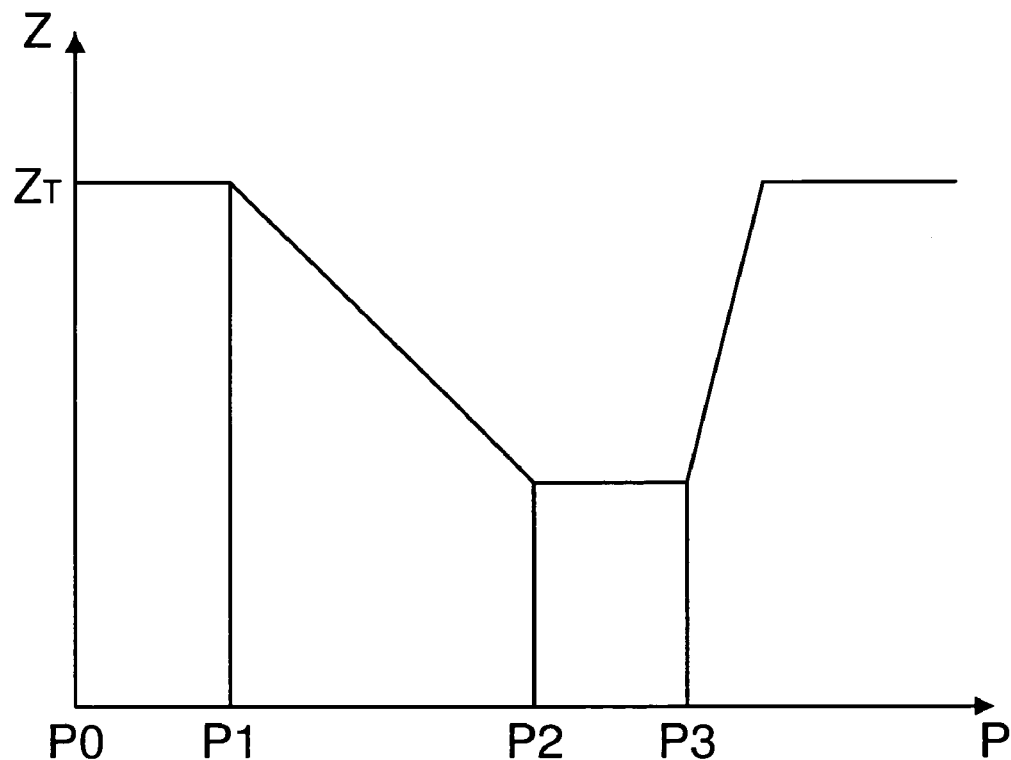
FIG. 12 depicts a graph showing the performance of the seal member suspension device in terms of the actuated position of the seal member as a function of over-pressure applied to the suspension device.

FIG. 12 shows the variation in the position along the Z direction of the seal member 4 when supported by a seal member suspension device 26 as depicted in FIG. 11. Between P0 and P1, the pre-tensioning of the spring member 52 prevents any displacement of the seal member 4 away from the maximal raising position $Z_T$. The pre-tension dominates the motion of piston 52 and forces the piston 48 (and the seal member 4) into a safety position. At P1, the downwards force exerted by the pressure in the housing 46 equals the pretension of the spring member 52. Beyond P1, the spring member 52 is gradually compressed (in order to continue to oppose the forces exerted by the seal member 4 and the pressure in the housing 46) and the pressure plate 50 and seal member 4 are gradually lowered, the small piston 48 remaining in contact with the pressure plate 50. In the region between P2 and P3, the spring member 52 is fully compressed and the small piston 48 is in contact with the pressure plate 50, the seal member 4 being in its lowest position. If the pressure P is increased further, however, the small piston 48 will be pushed clear of the pressure plate 50 by the pressure in the housing 46, the vertical position of the seal member 4 increasing rapidly with pressure until it reaches its maximal raised position $Z_T$ (in practice, this transition may be almost vertical). The operational regime for the purposes of imaging will be between pressures P2 and P3. In the case of system failure leading to excessively low or excessively high pressures within the housing 46, the seal member 4 will be pushed to a safety position $Z_T$.

Figure 4:
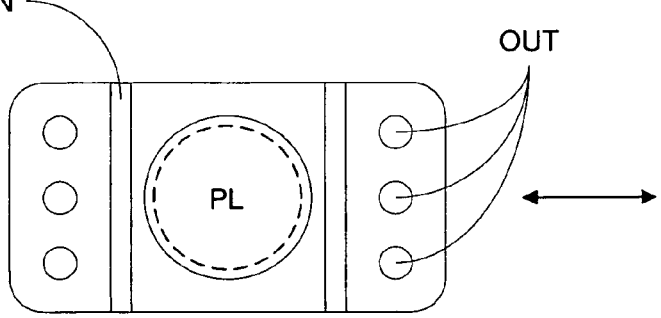
FIG. 4 depicts a liquid supply system according to an embodiment of the invention.
Figure 4:
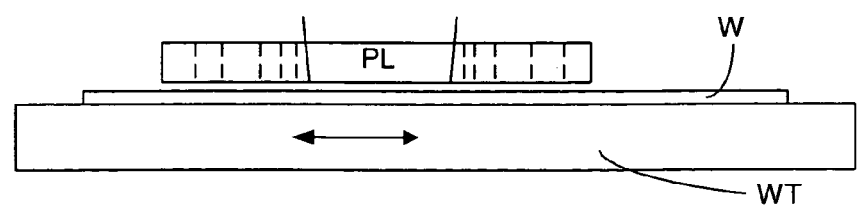

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application no. 03257072.3, hereby incorporated in its entirety by reference, the idea of a twin or dual stage immersion lithography apparatus is disclosed. Such an apparatus is provided with two substrate tables for supporting the substrate. Leveling measurements are carried out with a substrate table at a first position, without immersion liquid, and exposure is carried out with a substrate table at a second position, where immersion liquid is present. Alternatively, the apparatus can have only one substrate table moving between the first and second positions.

While embodiments of the present invention have been described in relation to a seal member, embodiments of the present invention may be applied to any immersion lithography apparatus and any liquid supply system (including relevant parts thereof), in particular, but not exclusively, to any of those liquid supply systems mentioned above and the bath of liquid as described above.

While specific embodiments of the invention have been described above, it will be appreciated that the invention may be practiced otherwise than as described. The description is not intended to limit the invention.

The invention claimed is:

1. A lithographic apparatus, comprising:
   a substrate table configured to hold a substrate;
   a projection system arranged to project a patterned beam of radiation onto a target portion of the substrate;
   a liquid supply system member configured to contain a liquid in a space between the projection system and the substrate; and
   a liquid supply system member compensator configured to apply a force to the liquid supply system member to at least partially compensate for an interaction between the liquid supply system member and the substrate table and coupled to a frame that is substantially mechanically isolated from the projection system, the isolated frame capable of supporting at least part of a reaction to a force applied by the liquid supply system member compensator to the liquid supply system member.

2. The apparatus according to claim 1, further comprising a liquid supply system member compensator controller and a liquid supply system member position determining device, the liquid supply system member compensator controller configured to apply a control force to the liquid supply system member, via the liquid supply system member compensator, based on a position of the liquid supply system member as measured by the liquid supply system member position determining device.

3. The apparatus according to claim 2, wherein the liquid supply system member position determining device is configured to determine a position of the liquid supply system member, relative to the projection system, a frame supporting at least a part of the projection system, or the frame substantially mechanically isolated from the projection system but which supports the reaction to the force applied by the liquid supply system member compensator to the liquid supply system member, along an axis substantially parallel to the optical axis of the projection system.

4. The apparatus according to claim 2, wherein the liquid supply system member position determining device determines a position of the liquid supply system member in a direction substantially perpendicular to the optical axis of the projection system.

5. The apparatus according to claim 1, further comprising a liquid supply system member compensator controller configured to apply a control force to the liquid supply system member, via the liquid supply system member compensator, according to data representing the magnitude of the interaction between the liquid supply system member and the substrate table.

6. The apparatus according to claim 1, wherein the liquid supply system member compensator comprises a focus calibration device configured to compensate a relative position of the substrate and a plane of best focus of the lithographic apparatus according to compensation data.

7. The apparatus according to claim 1, wherein the liquid supply system member compensator is coupled to the projection system or a frame supporting at least a part of the projection system, the projection system or frame being capable of supporting via the coupling at least part of the reaction to the force applied by the liquid supply system member compensator to the liquid supply system member.

8. The apparatus according to claim 1, further comprising a substrate table force compensator configured to determine the magnitude of the interaction between the liquid supply system member and the substrate table and transmit data representing the magnitude to the liquid supply system member compensator.

9. The apparatus according to claim 1, wherein the liquid supply system member compensator operates by means of at least one mechanism selected from the following list: an electromagnetic force using the Lorentz principle, an electromagnetic force using the reluctance principle, a bellows, and a mechanical spring.

10. A lithographic apparatus, comprising:
a substrate table configured to hold a substrate;
a projection system arranged to project a patterned beam of radiation onto a target portion of the substrate;
a liquid supply system member configured to contain a liquid in a space between the projection system and the substrate; and
a liquid supply system member compensator configured to compensate for a disturbance caused to the substrate table by a force exerted by the liquid supply system member toward the substrate table by applying a force to the liquid supply system member,
wherein the liquid supply system member compensator comprises a liquid supply system member compensation device configured to apply a force to the liquid supply system member to at least partially compensate for the force exerted by the liquid supply system member toward the substrate table and coupled to a frame that is substantially mechanically isolated from the projection system, the isolated frame capable of supporting via the coupling at least part of the reaction to the force applied by the liquid supply system member compensation device to the liquid supply system member.

11. The apparatus according to claim 10, further comprising a liquid supply system member compensator controller and a liquid supply system member position determining device, the liquid supply system member compensator controller configured to cause application of a force to the liquid supply system member based on a position of the liquid supply system member as measured by the liquid supply system member position determining device.

12. The apparatus according to claim 10, further comprising a liquid supply system member compensator controller configured to cause application of a control force to the liquid supply system member according to data representing the magnitude of the force applied by the liquid supply system member toward the substrate table.

13. A device manufacturing method, comprising:
containing a liquid in a space between a projection system of a lithographic apparatus and a substrate table using a liquid supply system member;
compensating for an interaction between the liquid supply system member and the substrate table by using a liquid supply system member compensator coupled to a frame that is substantially mechanically isolated from the projection system; and
projecting a patterned radiation beam through the liquid onto a target portion of the substrate using the projection system.

14. The method according to claim 13, comprising compensating a relative position of the substrate and a plane of best focus of the lithographic apparatus according to compensation data.

15. The method according to claim 14, wherein the compensation data is derived from determining a surface height profile, a surface tilt profile, or both of the substrate table when disturbed by the interaction with the liquid supply system member, the surface height profile being defined in a direction substantially parallel to the optical axis of a final element of the projection system and the surface tilt profile being defined with respect to one or two orthogonal axes of a plane substantially perpendicular to the optical axis of the final element of the projection system.

16. The method according to claim 14, comprising applying a force to the liquid supply system member to at least partially compensate for the interaction between the liquid supply system member and the substrate table.

17. The method according to claim 16, wherein the isolated frame supports, via the coupling, at least part of the reaction to the force applied by the liquid supply system member compensator to the liquid supply system member.

18. The method according to claim 16, comprising applying a control force to the liquid supply system member based on a position of the liquid supply system member.

19. The method according to claim 18, comprising determining a position of the liquid supply system member, relative to the projection system, a frame supporting at least a part of the projection system or the frame substantially mechanically isolated from the projection system, in a direction substantially parallel to the optical axis of the projection system, determining a position of the liquid supply system member in a direction substantially perpendicular to the optical axis of the projection system, or both.

* * * * *